US007288796B2

(12) United States Patent
Dry

(10) Patent No.: US 7,288,796 B2
(45) Date of Patent: *Oct. 30, 2007

(54) LIGHT EMITTING DIODE LIGHT SOURCE

(75) Inventor: Joel M. Dry, Winters, TX (US)

(73) Assignee: Optolum, Inc., Tempe, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 10/984,367

(22) Filed: Nov. 8, 2004

(65) Prior Publication Data

US 2005/0189554 A1 Sep. 1, 2005

Related U.S. Application Data

(63) Continuation of application No. 10/430,698, filed on May 5, 2003, now Pat. No. 6,815,724, which is a continuation-in-part of application No. 10/156,810, filed on May 29, 2002, now Pat. No. 6,573,536.

(51) Int. Cl.
*H01L 33/00* (2006.01)

(52) U.S. Cl. .......................... 257/88; 257/99; 257/712; 257/724; 257/E33.057; 257/E33.075; 362/555; 362/580; 362/582; 362/217; 362/218

(58) Field of Classification Search .................. 257/88
See application file for complete search history.

(56) References Cited

U.S. PATENT DOCUMENTS

| | | | | |
|---|---|---|---|---|
| 5,861,703 | A * | 1/1999 | Losinski | 310/330 |
| 5,890,794 | A * | 4/1999 | Abtahi et al. | 362/294 |
| 6,274,924 | B1 * | 8/2001 | Carey et al. | 257/676 |
| 6,411,046 | B1 * | 6/2002 | Muthu | 315/309 |
| 6,573,536 | B1 * | 6/2003 | Dry | 257/88 |
| 6,611,110 | B1 * | 8/2003 | Fregoso | 315/224 |
| 6,692,251 | B1 * | 2/2004 | Logan et al. | 433/29 |
| 2002/0056804 | A1 * | 5/2002 | Konagaya | 250/208.1 |
| 2002/0175597 | A1 * | 11/2002 | Raman et al. | 310/328 |

* cited by examiner

*Primary Examiner*—Tu-Tu Ho
(74) *Attorney, Agent, or Firm*—Donald J. Lenkszus

(57) ABSTRACT

A light source that utilizes light emitting diodes that emit white light is disclosed. The diodes are mounted on an elongate member having at least two surfaces upon which the light emitting diodes are mounted. The elongate member is thermally conductive and is utilized to cool the light emitting diodes. In the illustrative embodiment, the elongate member is a tubular member through which a heat transfer medium flows. A cooling or fluid movement device coupled with the elongate thermally conductive member enhances cooling of the light emitting diodes.

16 Claims, 4 Drawing Sheets

LIGHT EMITTING DIODE LIGHT SOURCE

RELATED APPLICATIONS

This application is a continuation of my application Ser. No. 10/430,698 filed May 5, 2003 now U.S. Pat. No. 6,815,724 which is a continuation-in-part of application Ser. No. 10/156,810 filed May 29, 2002 now U.S. Pat. No. 6,573,536.

FIELD OF THE INVENTION

This invention pertains to lighting sources, in general, and to a lighting source that utilizes Light Emitting Diodes (LED's), in particular.

BACKGROUND OF THE INVENTION

LED's have many advantages as light sources. However, in the past LED's have found application only as specialized light sources such as for vehicle brake lights, and other vehicle related lighting, and recently as flashlights. In these prior applications, the LED's are typically mounted in a planar fashion in a single plane that is disposed so as to be perpendicular to the viewing area. Typically the LED planar array is not used to provide illumination, but to provide signaling.

Recent attempts to provide LED light sources as sources of illumination have been few, and generally unsatisfactory from a general lighting standpoint.

It is highly desirable to provide a light source utilizing LED's that provides sufficient light output so as to be used as a general lighting source rather than as a signaling source.

One problem that has limited the use of LED's to specialty signaling and limited general illumination sources is that LED's typically generate significant amounts of heat. The heat is such that unless the heat is dissipated, the LED internal temperature will rise causing degradation or destruction of the LED.

It is therefore further desirable to provide an LED light source that efficiently conducts heat away from the LED's.

SUMMARY OF THE INVENTION

In accordance with the principles of the invention, an improved light source is provided. The light source includes an elongate thermally conductive member having an outer surface. A plurality of light emitting diodes is carried on the elongate member outer surface. At least some of the light emitting diodes are disposed in a first plane and others of said light emitting diodes are disposed in a second plane not coextensive with the first plane. Electrical conductors are carried by the elongate thermally conductive member and are connected to the plurality of light emitting diodes to supply electrical power thereto. The elongate thermally conductive member conducts heat away from the light emitting diodes to a thermally conductive fluid medium. A cooling device is utilized to remove heat from the light emitting diodes. In one aspect of the invention, the cooling device comprises a fluid moving device utilized to cause the fluid medium to flow to cause cooling of the elongate thermally conductive member and therefore to dissipate heat from the light emitting diodes. In another aspect of the invention, the cooling device may be an electronic or solid state device such as a Piezoelectric device or a device that uses the Peltier effect, known as a Peltier device.

In accordance with the principles of the invention, a temperature sensor is provided to determine the temperature of the light emitting diodes. The temperature sensor is coupled to a controller that monitors the temperature and controls the cooling device to vary the degree of cooling in accordance with the monitored temperature. In addition, the controller can be used to control the power provided to the light emitting diodes in response to the monitored temperature. Still further, the controller may be operated to control the light output provided by the light emitting diodes.

In the illustrative embodiment of the invention, the fluid medium is air and the fluid moving device is an air moving device.

In accordance with one aspect of the invention, an illustrative embodiment of the invention utilizes light emitting diodes that emit white light. However, other embodiments of the invention may utilize light emitting diodes that are of different colors to produce monochromatic light or the colors may be chosen to produce white light or other colors.

In accordance with another aspect of the invention the elongate thermally conductive member transfers heat from the light emitting diodes to a medium within said elongate thermally conductive member. In the illustrative embodiment of the invention, the medium is air.

In accordance with another aspect of the invention, the elongate thermally conductive member has one or more projections or fins to enhance heat transfer to the medium. The projections or fins may be disposed on the outer surface or inner surface of the elongate thermally conductive member or may be disposed on both the outer and inner surfaces.

In accordance with another aspect of the invention the elongate thermally conductive member comprises a tube. In one embodiment of the invention, the tube has a cross-section in the shape of a polygon. In another embodiment of the invention, the tube has a cross-section having flat portions.

In accordance with another embodiment of the invention, the elongate thermally conductive member comprises a channel.

In accordance with the principles of the invention, the elongate thermally conductive member may comprise an extrusion, and the extrusion can be highly thermally conductive material such as aluminum.

In one preferred embodiment of the invention the elongate thermally conductive member is a tubular member. The tubular member has a polygon cross-section. However, other embodiments my have a tubular member of triangular cross-section.

In one embodiment of the invention, a flexible circuit is carried on a surface of said elongate thermally conductive member; the flexible circuit includes the electrical conductors.

In another aspect of the invention, the flexible circuit comprises a plurality of apertures for receiving said plurality of light emitting diodes. Each of the light emitting diodes is disposed in a corresponding one of the apertures and affixed in thermally conductive contact with said elongate thermally conductive member.

The elongate thermally conductive member includes a thermal transfer media disposed therein in a flow channel.

At least one clip for mounting the elongate thermally conductive member in a fixture may be included.

BRIEF DESCRIPTION OF THE DRAWING

The invention will be better understood from a reading of the following detailed description of a preferred embodiment of the invention taken in conjunction with the drawing figures, in which like reference indications identify like elements, and in which.

DETAILED DESCRIPTION

Figure 2:
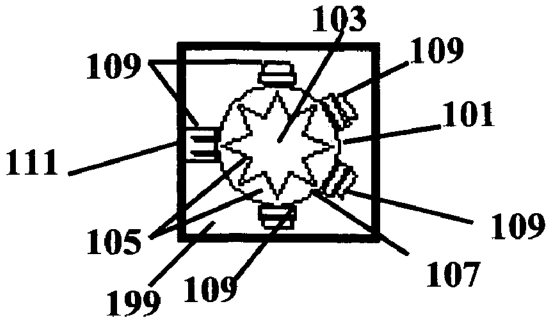
FIG. 2 is a top planar view of the light source of FIG. 1.
Figure 1:
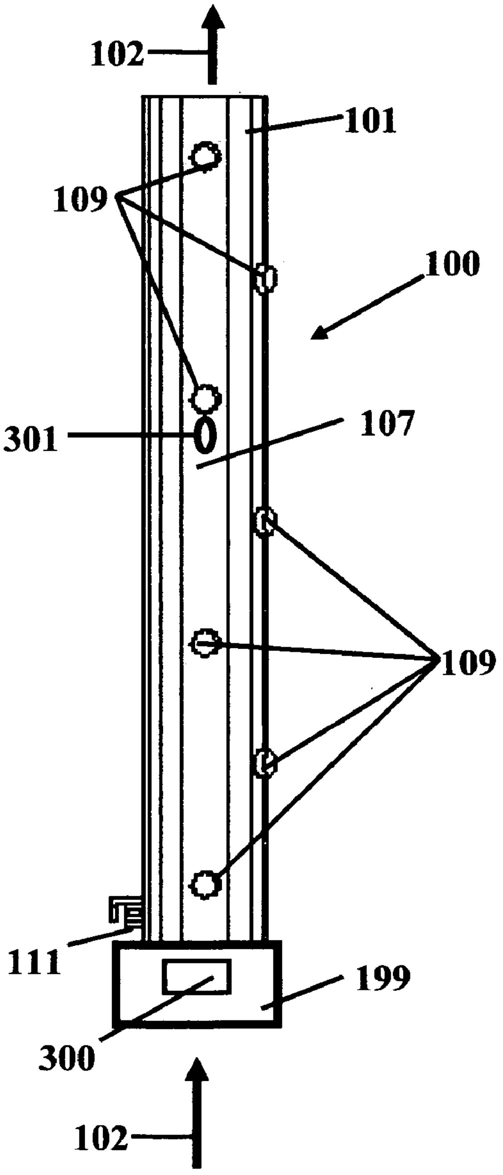
FIG. 1 is a planar side view of a light source in accordance with the principles of the invention.

A light source in accordance with the principles of the invention may be used as a decorative lighting element or may be utilized as a general illumination device. As shown in FIG. 1, a light source 100 in accordance with the invention includes an elongate thermally conductive member or heat sink 101. Elongate heat sink 101 is formed of a material that provides excellent thermal conductivity. Elongate heat sink 101 in the illustrative embodiment of the invention is a tubular aluminum extrusion. To improve the heat dissipative properties of light source 100, elongate heat sink 101 is configured to provide convective heat dissipation and cooling. As more clearly seen in FIG. 2, tubular heat sink 101 is hollow and has an interior cavity 103 that includes one or more surface discontinuities or heat dissipating protrusions 105. In the illustrative embodiment the surface discontinuities or heat dissipating protrusions 105 are triangular shaped fins, but may take on other shapes. In yet other embodiments, the surface discontinuities may include apertures or blind bores either alone or in combinations with heat dissipation protrusions. Protrusions 105 are integrally formed on the interior of elongate heat sink 101. In the illustrative embodiment movement of a medium 102 through elongate heat sink 101 provides cooling. Medium 102 utilized in the illustrative embodiment is air, but may in some applications be a fluid other than air to provide for greater heat dissipation and cooling.

Cooling device 199 is coupled to elongate thermally conductive member 101 to enhance cooling of the LED's. Cooling device in one embodiment of the invention is a medium moving device in fluid coupling with elongate thermally conductive member 101 to enhance the movement of medium 102. Medium moving device 199 is utilized to enhance fluid medium 102 to flow to cause cooling of the elongate thermally conductive member and therefore to dissipate heat from the light emitting diodes. Medium moving device 199 in a first illustrative embodiment is a fan and may be an electromechanical fan, electronic fan, or solid-state device such as a piezoelectric fan. In a second embodiment of the invention, cooling device 199 may comprise one or more solid state cooling devices utilizing the Peltier effect, otherwise known as Peltier devices. Although cooling device 199 is shown at one end of the light source 100, it will be appreciated by those skilled in the art that where solid state devices are utilized, a plurality of solid state devices may be positioned at locations other than on an end of the light source 100. It will also be appreciated by those skilled in the art that solid state cooling devices such as Piezoelectric and Peltier devices are known.

A controller 300 is provided in accordance with the principles of the invention. Controller 300 is coupled to a temperature sensor 301 that is disposed on light source 100 so as to monitor the temperature of the light emitting diodes 109. Controller 300 is utilized to control the rate of cooling provided by cooling device 199. It will be appreciated by those skilled in the art that although controller 300 and sensor 301 are shown separated from each other in the drawing, that such separation is provided merely for clarity in understanding the invention and controller 300 and sensor 301 may be fabricated as a single integrated device.

The exterior surface 107 of elongate heat sink 101 has a plurality of Light Emitting Diodes 109 disposed thereon. Each LED 109 in the illustrative embodiment comprises a white light emitting LED of a type that provides a high light output. Each LED 109 also generates significant amount of heat that must be dissipated to avoid thermal destruction of the LED. As noted above cooling device 199 provides cooling to avoid thermal destruction. By combining a plurality of LEDs 109 on elongate thermally conductive member or heat sink 101, a high light output light source that may be used for general lighting is provided.

Figure 6:
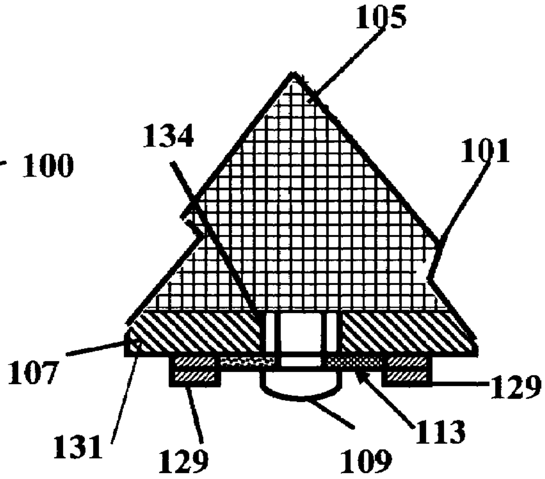
FIG. 6 is a partial cross-section of the light source of FIG. 1.

Conductive paths 129 are provided to connect LEDs 109 to an electrical connector 111. The conductive paths may be disposed on an electrically insulating layer 131 or layers disposed on exterior surface 107. In the illustrative embodiment shown in the drawing figures, the conductive paths and insulating layer are provided by means of one or more flexible printed circuits 113 that are permanently disposed on surface 107. As more easily seen in FIG. 6, printed circuit 113 includes an electrically insulating layer 131 that carries conductive paths 129. As will be appreciated by those skilled in the art, other means of providing the electrically conductive paths may be provided.

Flexible printed circuit 113 has LED's 109 mounted to it in a variety of orientations ranging from 360 degrees to 180 degrees and possibly others depending on the application. Electrical connector 111 is disposed at one end of printed circuit 113. Connector 111 is coupleable to a separate power supply to receive electrical current. Flexible printed circuit 113, in the illustrative embodiment is coated with a non-electrically conductive epoxy that may be infused with optically reflective materials. Flexible printed circuit 113 is adhered to the tube 101 with a heat conducting epoxy to aid in the transmission of the heat from LEDs 109 to tube 101. Flexible printed circuit 113 has mounting holes 134 for receiving LEDs 109 such that the backs of LEDs 109 are in thermal contact with the tube surface 107.

Tubular heat sink 101 in the illustrative embodiment is formed in the shape of a polygon and may have any number of sides. Although tubular heat sink 101 in the illustrative embodiment is extruded aluminum, tubular heat sink 101 may comprise other thermal conductive material. Fins 105 may vary in number and location depending on particular LED layouts and wattage. In some instances, surface discontinuities such as heat dissipation protrusions or fins may be added to the exterior surface of tubular heat sink 101. In addition, apertures may be added as surface discontinuities to the tubular heat sink to enhance heat flow.

Figure 7:
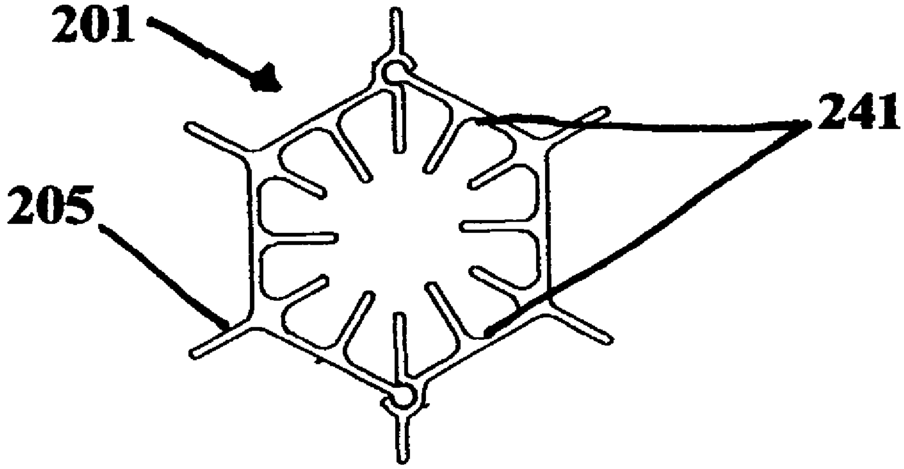
FIG. 7 is a top view of an alternate elongate thermally conductive member.
Figure 8:
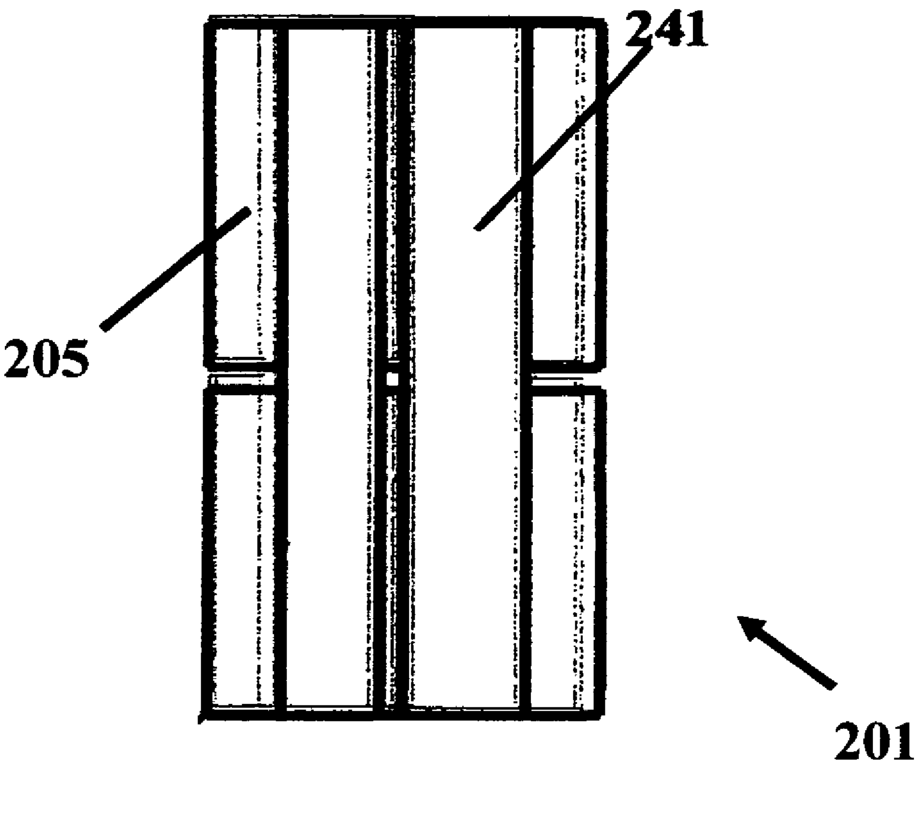
FIG. 8 is a side view of the member of FIG. 7.

FIGS. 7 and 8 show an alternate elongate thermally conductive member 201 that has both exterior surface discontinuities or heat dissipation protrusions or fins 205 in addition to interior surface discontinuities or heat dissipation protrusions or fins 241.

Figure 9:
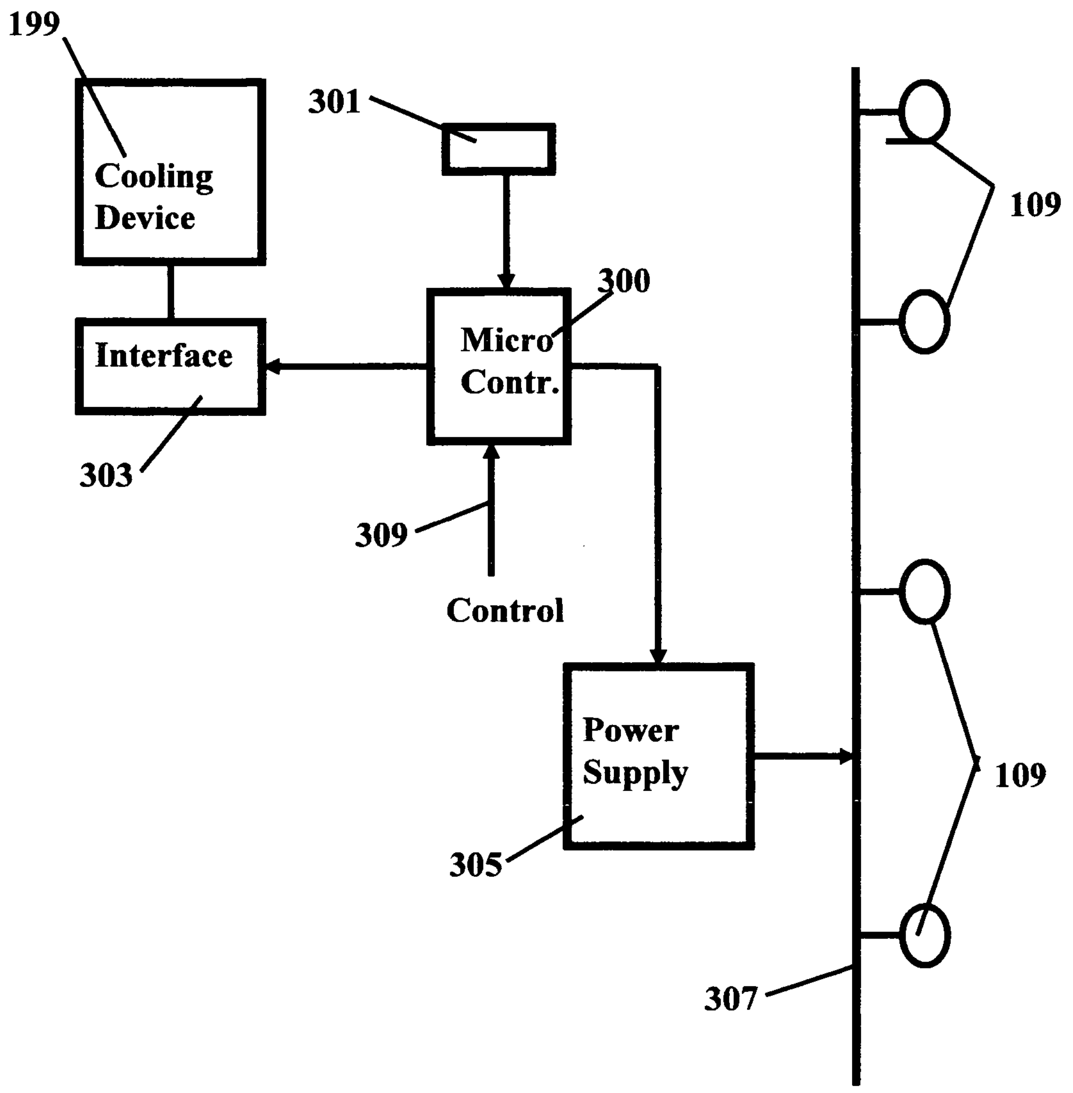
FIG. 9 is a block diagram of a control arrangement for the light source of the invention.

Turning now to FIG. 9, controller 300 is advantageously utilized in accordance with the principles of the invention. Controller 300 may be any one of a number of commercially available controllers. Each such controller is programmable and includes a processor, and memory (which are not shown). Controller 300 memory is utilized to program operation of the microprocessor. It will be appreciated by those skilled in the art that controller 300 may be integrated into the same chip as sensor 301 and interface 303 that is utilized to interface controller 300 to the cooling device 199. Controller 300 is programmed so that when temperature sensor 301 detects a temperature that is too high, cooling device 199 is activated or, if activated at less than full capacity, is activated to a higher cooling capacity. In addition, controller 300 is coupled to power supply 305, which in turn provides power to LED's 109 at the appropriate voltage level and type via power bus 307, so that the amount of power provided to LED's 109 may also be regulated to control the amount of power dissipated by LED's 109. Controller 300 controls the amount of cooling provided by cooling device 199. The amount of cooling provided by cooling device 199 is increased when temperature sensor 301 indicates a predetermined temperature. In addition, controller 300 will turn off all LED's 109 in the event that a second predetermined temperature threshold is reached or exceeded. Controller 300 also operates to increase the power provided to LED's 109 in the event that the temperature sensed is below another predetermined threshold. Controller 300 has control input 309 to receive control inputs to determine the on-off status of LED's 109 and to determine the brightness level output of LED's 109. In addition, controller 300 is programmed to be responsive to control signals that will command controller 300 to brighten or dim the light output of LED's 109. Interface 303 is provides the appropriate interface between controller 300 and cooling device 199

Figure 3:
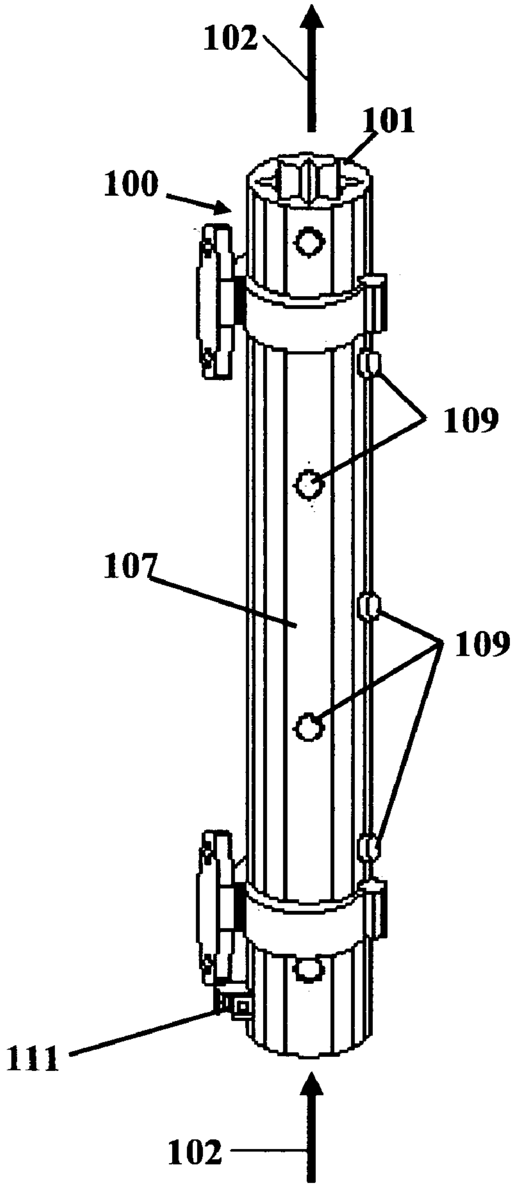
FIG. 3 is a perspective view of the light source of FIG. 1 with mounting clips.
Figure 5:
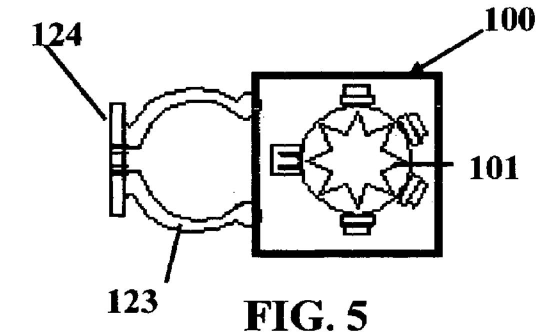
FIG. 5 is a top view of the light source and mounting clips of FIG. 4.
Figure 4:
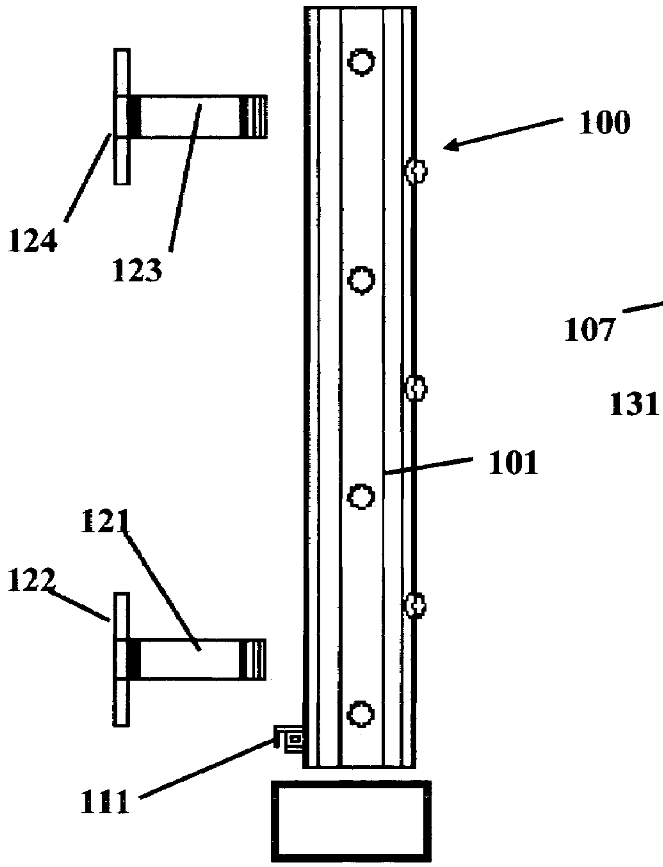
FIG. 4 is a planar side view of the light source of FIG. 3 showing mounting clips separated from the light source.

Light source 100 is mounted into a fixture and retained in position by mounting clips 121,123 as most clearly seen in FIGS. 3, 4, and 5. Each of the clips is shaped so as to engage and retain light source 100. Each clip is affixed on one surface 122, 124 to a light fixture.

Although light source 100 is shown as comprising elongate tubular thermally conductive members or heat sinks 101, 201, other extruded elongate members may be used such as channels.

In the illustrative embodiment shown, cooling by flow of air through elongate thermally conductive members or tubular heat sinks 101, 201 is utilized such that cool or unheated air enters elongate thermally conductive members 101, 201 by fluid movement device 199, passes over the surface discontinuities or heat dissipation protrusions, and exits from the opposite end of elongate thermally conductive member 101, 201 as heated air. In higher wattage light sources, rather than utilizing air as the cooling medium, other fluids may be utilized. In particular, convective heat pumping may be used to remove heat from the interior of the heat sink.

In one particularly advantageous embodiment of the invention, the light source of the invention is configured to replace compact fluorescent lighting in decorative applications.

It will be appreciated by those skilled in the art that although the invention has been described in terms of light emitting diodes, the invention is equally applicable to other non-filament miniature lights sources such as organic light emitting diodes (OLED's) and polymer type light sources. It is intended that the term "light emitting diode" or "LED" as used in the claims is intended to not be limited to solid state light emitting diodes, but is intended to include such other miniature light sources.

It has further been determined that the uniformity of light distribution of a light source having an elongate thermally conductive member with heat dissipation protrusions or fins 205 on the outer surface of the elongate thermally conductive member 201 is enhanced by utilization of an appropriately selected coating or treatment to the outer or exterior surfaces of elongate thermally conductive member 201. In particular, in a comparison of various surface coatings or treatments, it has been found that the use of a non-reflective or black surface on the protrusions or fins 205 provides a more uniform light output. It has been determined that the use of reflective or white surfaces on protrusions results in the protrusions producing shadows in the light output.

As will be appreciated by those skilled in the art, the principles of the invention are not limited to the use of light emitting diodes that emit white light. Different colored light emitting diodes may be used to produce monochromatic light or to produce light that is the combination of different colors.

Controller 300 is programmable to be further responsive to control signals 309 to control which of different colored LED's are activated and the amount of power provided to the different colors such that the color output of lights source 100 is varied.

Although the invention has been described in terms of illustrative embodiments, it is not intended that the invention be limited to the illustrative embodiments shown and described. It will be apparent to those skilled in the art that various changes and modifications may be made to the embodiments shown and described without departing from the spirit or scope of the invention. It is intended that the invention be limited only by the claims appended hereto.

What is claimed is:

1. A light source comprising:

an elongate thermally conductive channel;

a surface proximate said channel and thermally coupled to said channel a plurality of light emitting diodes (LED's) carried on said surface, at least some of said light emitting diodes being disposed in a first plane and others of said light emitting diodes being disposed in a second plane not coextensive with said first plane;

said elongate thermally conductive channel being configured to conduct heat away from said light emitting diodes to fluid contained by said elongate thermally conductive channel;

temperature sensing apparatus providing signals representative of the temperature of said light emitting diodes; and a controller coupled to said LED's and to said temperature sensing apparatus for controlling the temperature of said LED's dependent upon predetermined temperatures.

2. A light source in accordance with claim 1, comprising:

a cooling device coupled to said elongate thermally conductive channel to enhance cooling of said LED's, said cooling device being controllable by said controller.

3. A light source in accordance with claim 2, wherein:

said cooling device comprises an electromechanical device.

4. A light source in accordance with claim 3, wherein:

said electromechanical device comprises a fan.

5. A light source in accordance with claim 2, wherein: said cooling device comprises an electronic device.

6. A light source in accordance with claim 2, wherein: said cooling device comprises a solid state device.

7. A light source in accordance with claim 2, wherein: said cooling device comprises an piezoelectric device.

8. A light source in accordance with claim 1, wherein: said elongate thermally conductive member is configured to conduct heat away from said light emitting diodes to fluid proximate said surface.

9. A light source in accordance with claim 7, wherein: said fluid proximate said surface comprises air.

10. A light source in accordance with claim 2, wherein: said cooling device comprises a fan.

11. A light source in accordance with claim 2, wherein: said cooling device comprises a Peltier device.

12. A light source in accordance with claim 1, wherein: said controller controls the amount of power provided to each of said LED's.

13. A light source in accordance with claim 12, wherein: said controller determines the amount of power provided to each of said LED's based upon control signal inputs.

14. A light source in accordance with claim 13, wherein: said controller determines the amount of power provided to each of said LED's in dependence upon signals received from said temperature sensor.

15. A light source in accordance with claim 1, wherein: at least some of said light emitting diodes emit colored light.

16. A light source in accordance with claim 15, wherein: said controller controls each of said light emitting diodes to control the color of the light output of said light source.

* * * * *